(12) United States Patent
Fish et al.

(10) Patent No.: US 8,328,494 B2
(45) Date of Patent: Dec. 11, 2012

(54) IN VACUUM OPTICAL WAFER HEATER FOR CRYOGENIC PROCESSING

(75) Inventors: Roger B. Fish, Bedford, MA (US); Jeffrey E. Krampert, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 210 days.

(21) Appl. No.: 12/638,221

(22) Filed: Dec. 15, 2009

(65) Prior Publication Data
US 2011/0143461 A1 Jun. 16, 2011

(51) Int. Cl.
*B65G 25/00* (2006.01)
*B66C 17/08* (2006.01)
*H01L 21/67* (2006.01)

(52) U.S. Cl. ........ 414/150; 414/147; 414/935; 414/939; 438/5; 438/510; 438/522; 257/E21.529; 257/E21.471

(58) Field of Classification Search .................. 414/939; 438/5, 510, 522
See application file for complete search history.

(56) References Cited

U.S. PATENT DOCUMENTS

| 5,279,671 | A  | * | 1/1994  | Hosokawa      | 118/725    |
|-----------|----|---|---------|---------------|------------|
| 6,486,444 | B1 |   | 11/2002 | Fairbairn et al. |         |
| 2002/0020358 | A1 | * | 2/2002 | Hey et al. | 118/725 |
| 2008/0019806 | A1 |   | 1/2008 | Myo et al. |       |
| 2008/0044938 | A1 |   | 2/2008 | England et al. |    |
| 2010/0301236 | A1 | * | 12/2010 | Shieh et al. | 250/492.21 |

FOREIGN PATENT DOCUMENTS

| JP | 9115985 A    | 5/1997  |
|----|--------------|---------|
| JP | 2002367976 A | 12/2002 |

* cited by examiner

*Primary Examiner* — Angel Roman

(57) ABSTRACT

A vacuum assembly used for warming processed substrates above the dew point to prevent unwanted moisture on the processed substrate surfaces as well as reducing negative impact on manufacturing throughput. The vacuum assembly includes a processing chamber, a substrate handling robot, and a heater which may be an optical heater. The processing chamber is configured to cryogenically process one or more substrates. The transfer chamber is connected to the processing chamber and houses the substrate handling robot. The substrate handling robot is configured to displace one or more substrates from the processing chamber to the transfer chamber. The heater is connected to the transfer chamber above the substrate handling robot such that the heater emits energy incident on the substrate when the substrate handling robot displaces the substrate in the transfer chamber.

19 Claims, 4 Drawing Sheets

IN VACUUM OPTICAL WAFER HEATER FOR CRYOGENIC PROCESSING

BACKGROUND OF THE INVENTION

1. Field of the Invention

Embodiments of the invention relate to the field of semiconductor device fabrication. More particularly, the present invention relates to an apparatus for warming processed substrates above the dew point to prevent unwanted moisture on the processed substrate surfaces as well as reducing negative impact on manufacturing throughput.

2. Discussion of Related Art

Ion implantation is a process used to dope impurity ions into a semiconductor substrate to obtain desired device characteristics. An ion beam is directed from an ion source chamber toward a substrate. The depth of implantation into the substrate is based on the ion implant energy and the mass of the ions generated in the source chamber. One or more ion species may be implanted at different energy and dose levels to obtain desired device structures. In addition, the beam dose (the amount of ions implanted in the substrate) and the beam current (the uniformity of the ion beard can be manipulated to provide a desired doping profile in the substrate. However, throughput or manufacturing of semiconductor devices is highly dependent on the uniformity of the ion beam on the target substrate to produce the desired semiconductor device characteristics.

FIG. 1 is a block diagram, of an ion implanter 100 including an ion source chamber 102. A power supply 101 supplies the required energy to source 102 which is configured to generate ions of a particular species. The generated ions are extracted from the source through a series of electrodes 104 and formed into a beam 10 which passes through a mass analyzer magnet 106. The mass analyzer is configured with a particular magnetic field such that only the ions with a desired mass-to-charge ratio are able to travel through the analyzer for maximum transmission through, the mass resolving slit 107. Ions of the desired species pass from mass slit 107 through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some embodiments, a second deceleration stage 112 may be disposed between corrector magnet 110 and support 114. The ions lose energy when they collide with electrons and nuclei in the substrate and come to rest at a desired depth within the substrate based on the acceleration energy.

A relatively low substrate or wafer temperature during ion implantation improves implant performance. Typically, the substrate is cooled by reducing the temperature of the platen 114 upon which the wafer is disposed in the range of between room temperature to about −100° C. Lower wafer temperatures reduce the amount of damage caused when ions hit the substrate (damage layer). This decreased damage layer improves device leakage currents and allows manufacturers to create abrupt source-drain extensions and ultra-shallow junctions needed for today's semiconductor devices. When the temperature of the wafer is decreased, the thickness of the amorphous silicon layer increases because of a reduction in the self-annealing effect. With a thicker amorphous layer, less tail channeling is expected. Damage created by beam ions is confined in the amorphous region and less damage is introduced into the crystalline region immediately beyond the amorphous-crystalline interface.

In addition to the benefits introduced by a thicker amorphous silicon layer, performing ion implantation at low temperatures also minimizes the movement of Frenkel pairs during implantation. As a result, fewer Frenkel pairs are pushed into the region beyond the amorphous-crystalline interface as compared to the case of higher substrate temperature implantation. Most of the Frenkel pairs will grow back into the lattice during the solid-phase epitaxy process and do not contribute to excess interstitials which cause transient enhanced diffusion or form extended defects. With fewer interstitials pushing channel or halo dopants into a channel region, less negative coupling; such as reverse short channel effect, may be achieved. Thus, better process control and prediction of device performance is obtained.

Once the substrate is cryogenically processed, the temperature of the processed wafer is below the dew point and must eventually be warmed to normal atmospheric temperature for removal from the implanter. However, processed wafers cannot go from a vacuum environment during implantation to normal atmospheric temperature without creating a coating of condensation on the surface of the wafer or even worse, frost when the wafer is below 0° C., may compromise the processed wafer. Current attempts to avoid such moisture during the warming process provide for placement of the processed wafer into a loadlock chamber and introducing nitrogen gas into the loadlock as a convection warming fluid. However, this warming process takes from approximately five (5) to ten (10) minutes. In particular, wafers from the process chamber must wait until the temperature of the wafers being warmed in the loadlock rises before transferring these wafers out of the loadlock chamber and the deposit of additional unprocessed wafers into the loadlock. This reduces valuable wafer processing time which negatively impacts manufacturing throughput. Accordingly, there is a need to warm wafers or substrates which undergo cryogenic processing above the dew point to avoid unwanted condensation on the surface of the processed wafers.

SUMMARY OF THE INVENTION

Exemplary embodiments of the present invention are directed to a vacuum assembly for warming processed substrates above the dew point to prevent unwanted condensation on the processed substrate surfaces. In an exemplary embodiment, such a vacuum assembly includes a processing chamber, a substrate handling robot, and a heater or other radiative energy source. The processing chamber is configured to cryogenically process one or more substrates. The transfer chamber is connected to the processing chamber and houses the substrate handling robot. The substrate handling robot is configured to displace one or more substrates from the processing chamber to the transfer chamber. The heater is connected to the transfer chamber above the substrate handling robot such that the heater emits energy on at least one of the one or more substrates when the substrate handling robot displaces at least one substrate in the transfer chamber.

DESCRIPTION OF EMBODIMENTS

Figure 1:
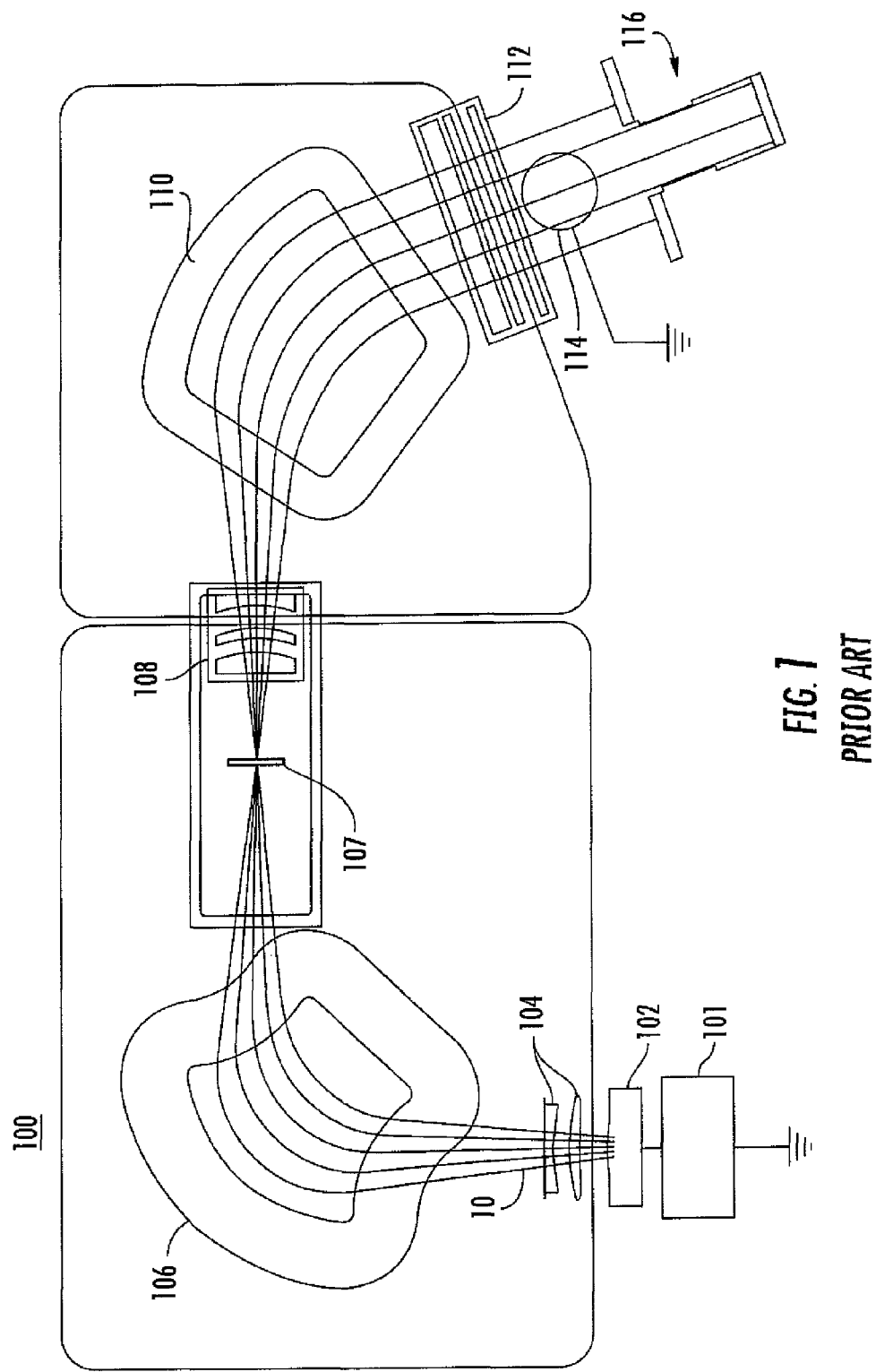
FIG. 1 illustrates a block diagram of a representative ion implanter.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
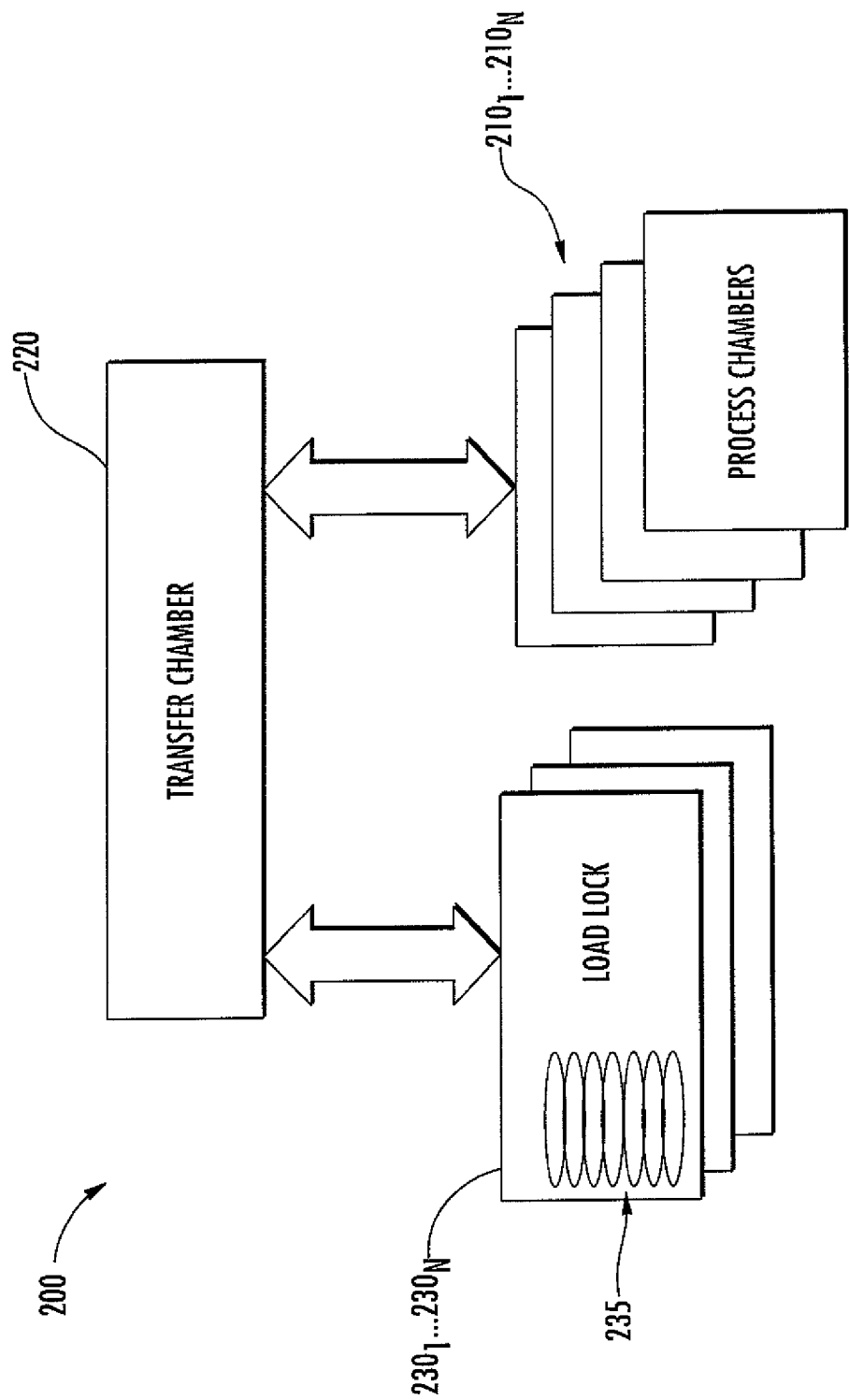
FIG. 2 is a functional block diagram of an exemplary vacuum processing system used in an ion implanter in accordance with an embodiment of the present disclosure.

FIG. 2 is a functional block diagram of a vacuum processing system 200 used in the fabrication of integrated circuits, flat panel displays, etc. The vacuum processing system 200 includes one or more processing chambers $210_1 \ldots 210_N$, transfer chamber 220 and one or more loadlock chambers $230_1 \ldots 230_N$. Each process chamber houses a support or platen 114 (shown in FIG. 1) which receives a wafer or substrate for processing. Support 114 may be disposed on a pair of support arms (not shown) configured to introduce coolant, for example Helium or Nitrogen (at −180 C), therethrough to reduce the temperature of the wafer disposed on the platen 114 for cryogenic processing. Alternatively, a separate cooling unit may be employed to cool a wafer to a predetermined, temperature range. Typically, a desired temperature range for low-temperature ion implantation is well below room temperature, and often below the freezing point of pure water. Although the low temperature of liquid nitrogen might be desirable to reduce the temperature of a wafer or substrate for cryogenic processing, such an extreme temperature may not be necessary or practicable for all ion implantations. According to one embodiment, a temperature between −110° C. and −40° C. may be sufficient for most applications.

Figure 3:
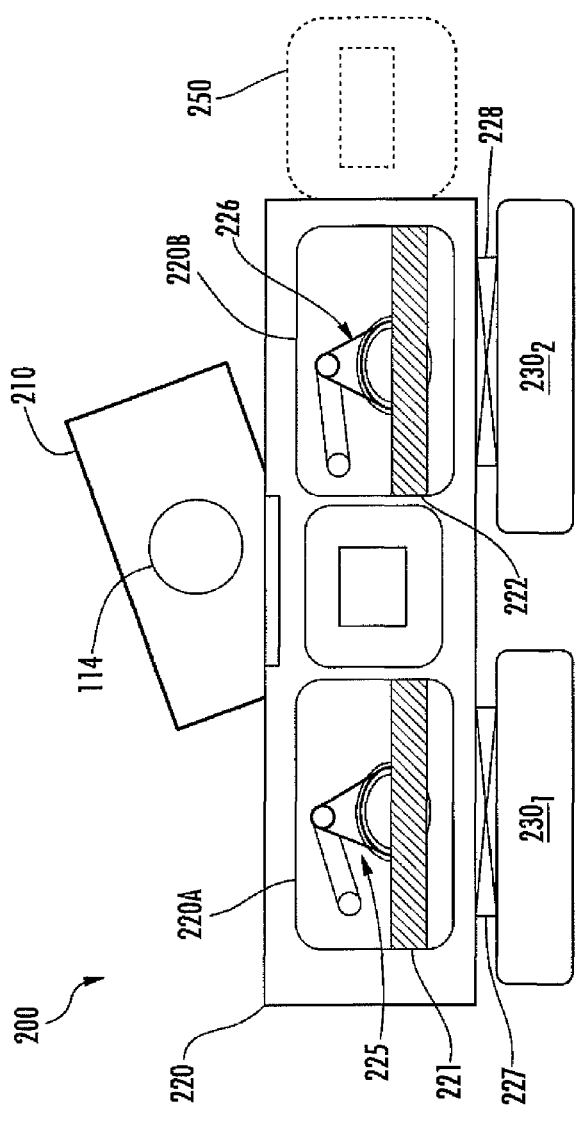
FIG. 3 is a top view of the vacuum processing system of an ion implanter shown functionally in FIG. 2 in accordance with an embodiment of the present disclosure.
Figure 4:
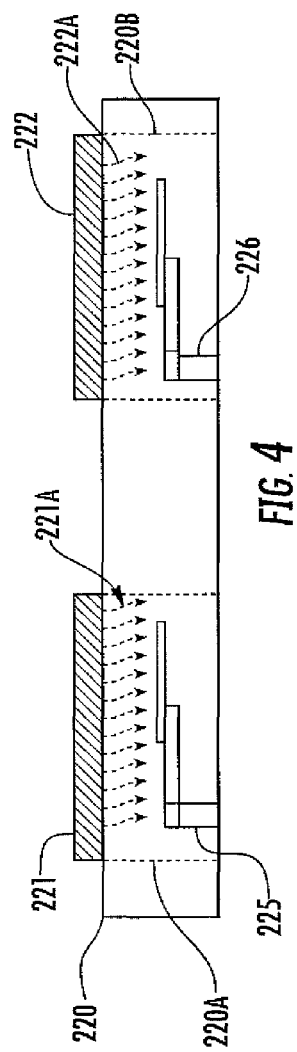
FIG. 4 is a side view of the vacuum processing system of an ion implanter shown in FIG. 3 in accordance with an embodiment of the present disclosure.

The transfer chamber 220 is connected to the load locks $230_1 \ldots 230_N$ and to process chambers $210_1 \ldots 210_N$. The transfer chamber 220 houses one or more substrate handling robots (as shown in FIG. 3-4. The handling robots retrieve wafers or substrates stored in loadlock chambers $230_1 \ldots 230_N$ and transfers them to one or more of the process chambers $210_1 \ldots 210_N$. The pressure in the transfer chamber 220 is typically held at a constant vacuum while the process chambers may be kept at a higher or lower vacuum depending on the desired implant process. Transfer chamber 220 includes one or more slit or isolation valves (shown in FIG. 3) through which a wafer or substrate passes to and from load locks $230_1 \ldots 230_N$. These slit valves isolate the transfer chamber 220 from a respective loadlock. Once wafer processing is completed, the pressure in the respective processing chambers $210_1 \ldots 210_N$ returns to the level of the transfer chamber 220 to allow the wafers or substrates to be transferred back to a loadlock $230_1 \ldots 230_N$ by one of the robot arms via transfer chamber 220.

Loadlock chambers $230_1 \ldots 230_N$ can be configured to store multiple processed and unprocessed wafers 235. In particular, a loadlock chamber may Include a plurality of cassettes which house the plurality of substrates or wafers. The substrates are stacked vertically within a cassette and are spaced apart sufficiently for the wafer handling robot arms to reach under a substrate or wafer to remove it from or place it a respective loadlock $230_1 \ldots 230_N$. A loadlock chamber $230_1 \ldots 230_N$ may selectively cycle between the pressure level of the ambient environment and the pressure level in the transfer chamber 220 during processing. Once all the wafers or substrates within a loadlock cassette have been processed, the cassette is removed by a robot or operator and a new cassette of unprocessed wafers or substrates is placed in a loadlock chamber $230_1 \ldots 230_N$. As mentioned above, a previous cryogenic wafer processing method warmed the wafers in a loadlock using dry $N_2$ gas as a convection, warming fluid. However, this required relatively long warming times which negatively impacted processing throughput.

FIG. 3 is a top plan view of a vacuum processing system 200 associated with an ion implanter including process chamber 210, transfer chamber 220, and loadlock chambers $230_1$, $230_2$. Unprocessed wafers stored in loadlock chambers are transferred to process chamber 210 and transferred, back to one of the loadlocks after processing. Loadlock chambers house a plurality of wafers or substrates which have been or are awaiting processing. Transfer chamber 229 has a first portion 220A which houses a first substrate handling robot 225 and a second portion 220B which houses a second substrate handling robot 226. Each robot 225, 226 retrieves wafers or substrates from respective loadlocks $230_1$, $230_2$ via slit or isolation valves 227, 228 and transfers the wafers or substrates to processing chamber 210. The slit or isolation, valves 227, 228 are configured to isolate transfer chamber 220 from, the loadlocks $230_1$, $230_2$ and maintain the desired pressure inside the transfer chamber 320. Each handling robot 225, 226 positions a wafer on platen 114 of process chamber 210 where the temperature of the wafer is reduced to, for example between −110° C. and −40° C. associated with cryogenic processing.

Once a wafer or substrate has undergone processing, such as by ion implantation, in process chamber 210 robot arm 225 retrieves the wafer or substrate and transfers it to portion 220A of transfer chamber 220. Portion 220A includes a heater 221 disposed above robot arm 225. As the processed wafer is transferred back to loadlock $230_1$, the processed wafer passes under a wideband or localised beater 221 in transfer chamber portion 220A. Heater 221 is disposed in-line such that a separate process step to heat the processed wafer above the dew point is obviated. Heater 221 emits photons or other energy source which emits RF or Microwave energy which is efficiently coupled for absorption by the wafer or substrate. Although heater 221 is illustrated as a wideband device which extends across transfer chamber portion 220A, the heater 221 may be a localized heater having a substantially circular shape or other shape corresponding to the shape of the wafer or substrate. In this manner, a pair of mounting brackets not shown are attached, to the heater to align it above the wafer or substrate disposed, in robot arm 225.

The processed wafer is warmed to a temperature above the dew point through the absorption of energy from heater 221. This warming process may take approximately 5-20 seconds depending, of course, on the cryogenic processing temperature and the power of the heater 221. Attention is also directed to not heating the substrate too quickly or subjecting it to too large of a temperature change that may thermally shock the substrate. Once warmed above the dew point or the desired temperature, the processed wafer is transferred to load lock 230a via slit valve 227. Thus, heater 221 is positioned in-line such that the normal trajectory or path of the processed wafer as it travels from the process chamber 210 back to loadlock $230_1$ subjects the wafer to the projected optical field of heater 221.

Similarly, after a wafer or substrate has undergone cryogenic processing, such as by ion implantation, in process chamber 210, robot arm 226 retrieves the wafer or substrate and transfers it to portion 220B of transfer chamber 220. Portion 220B includes an optical heater 222 disposed above robot arm 226. As the processed wafer is transferred back to loadlock $230_2$, the processed wafer passes under a wideband of optical energy emitted from heater 222 in portion 220B of transfer chamber 220. Alternatively, heater 222 may be a localised heater having a substantially circular or other shape corresponding to the shape of the wafer or substrate as mentioned above. The processed wafer is warmed to a temperature above the dew point through the absorption of photons from optical heater 222. Once warmed above the dew point or other desired temperature, the processed wafer is transferred to loadlock $230_2$ via slit valve 228. Thus, heater 222 is positioned in-line such that the normal trajectory or path of the processed wafer as it travels from the process chamber 210 back to loadlock $230_2$ subjects the wafer to the projected energy of heater 222. In this manner, each processed wafer or substrate is warmed as it passes from the process chamber 210 where it was exposed to cryogenic processing, back to a respective loadlock chamber $230_1$, $230_2$. This process avoids prolonged convection warming times, thereby increasing wafer or substrate processing speeds. By utilizing such an in-line process to warm cryogenically processed wafers, additional handling or processing steps are not needed which may negatively impact manufacturing throughput.

Alternatively, an off-line heating station 250 attached to portion 220B of transfer chamber 220 may be utilized. In particular, offline heating station 250 may include one or more heaters 221, 222 which are configured as optical heaters emitting optical energy. After a wafer undergoes cryogenic processing in process chamber 210, robot arm 226 retrieves the processed wafer and transfers it to off-line heating station 250 where it is subject to optical energy emitted from the heater. Once the wafer or a plurality of wafers is warmed to a temperature above the dew point through, the absorption of energy from the optical heater, the wafer is retrieved by robot arm 226 and transferred to load lock $230_2$ via slit valve 228. An additional off-line heating may also be attached to portion 220A at the other end of transfer chamber 220. This additional heating station would be configured similar to station 250 and is configured to accommodate wafers retrieved from process chamber 210 via robot arm 225. This station warms the processed wafers to above the dew point by one or more optical heaters and robot arm 225 transfers the wafer to load loch $230_1$ via slit valve 227.

FIG. 4 is a side view of transfer chamber 220 including optical heaters 221 and 222. Portion 220A of transfer chamber 220 houses first, robot arm 225. Portion 220B of transfer chamber 220 houses second robot arm 226. Heater 221 is positioned above transfer portion 220A and is configured to emit a wideband of optical energy 221A projected on a cryogenic processed wafer disposed on robot arm 225. Similarly, heater 222 is positioned above portion 220B and is configured to emit a wideband of optical, energy 222A projected on a cryogenic processed wafer disposed on robot arm 226. Each of the optical heaters 221, 222 may be configured to output optical energy at one or more frequencies to efficiently heat a cryogenic processed wafer above the dew point.

Figure 5:
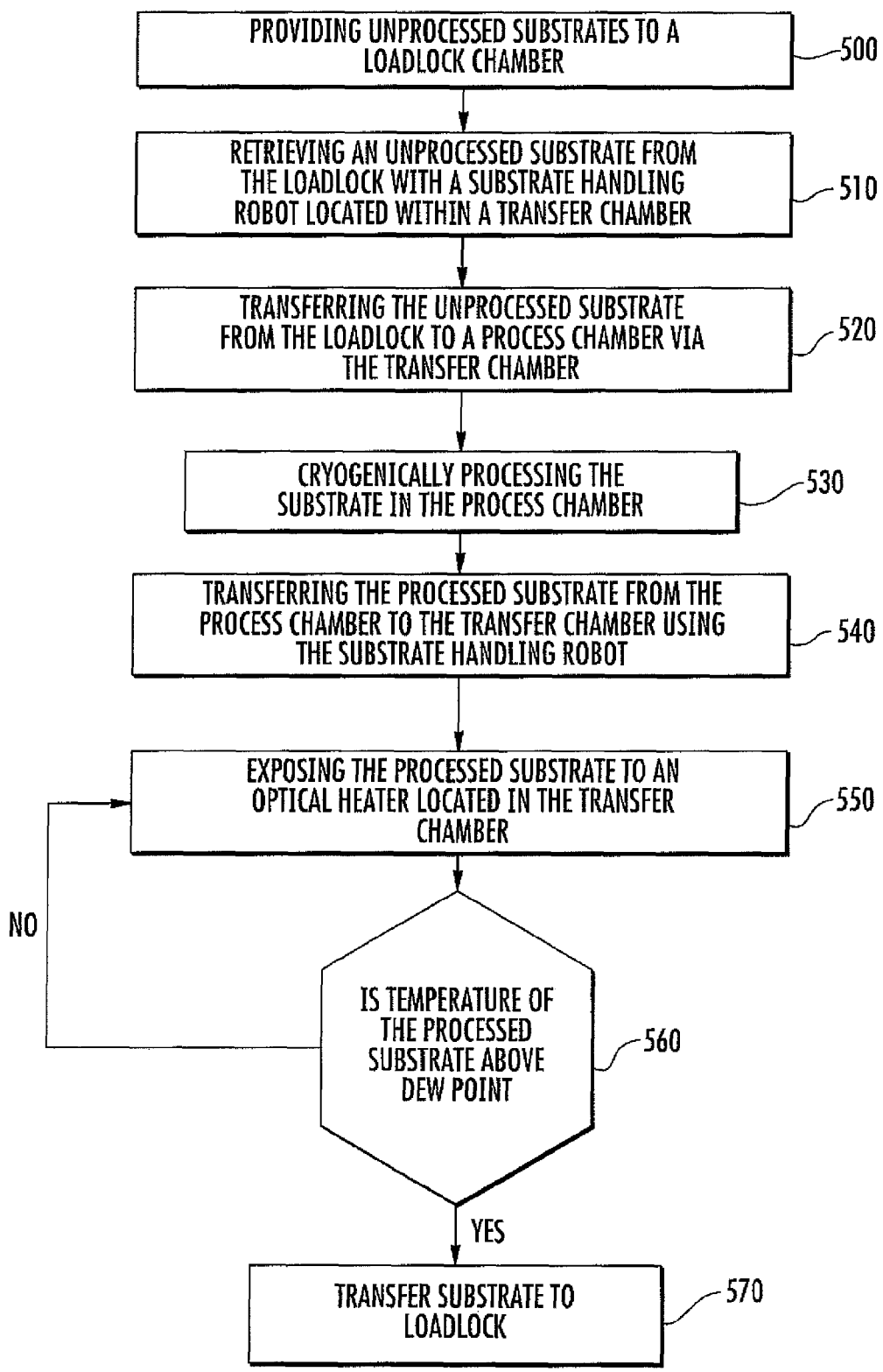
FIG. 5 is a flow chart of exemplary wafer processing steps utilizing the vacuum processing system of FIGS. 3, 4 in accordance with an embodiment of the present disclosure.

FIG. 5 is a flow chart illustrating an exemplary process for heating a cryogenically processed wafer or substrate in a vacuum processing system 300. At step 500, an unprocessed, substrate is provided to the loadlock. The unprocessed substrate is retrieved from the loadlock using the substrate handling robot located within the transfer chamber at step 510. The unprocessed substrate is transferred from the loadlock to a process chamber using the substrate handling robot at step 520. At step 530, the substrate is cryogenically processed in the process chamber. The processed substrate is transferred from the process chamber to the transfer chamber using the substrate handling robot at step 540.

At step 550, the processed substrate is exposed to optical energy from an optical heater located above the substrate handling robot in the transfer chamber. A determination is made at step 560 whether or not the substrate is warmed from the cryogenic processing temperature to above the dew point temperature. If the substrate is warmed, to above the dew point temperature, the substrate is transferred to the loadlock at step 570. If the substrate is not warmed to above the dew point or to a desired temperature, the process continues to warm, the substrate using the optical heater at step 550 until the temperature of the substrate is above the dew point or the desired temperature. In this manner, each processed wafer or substrate is warmed to a temperature above the dew point as it passes from a process chamber where it was exposed to cryogenic processing, back to a respective loadlock chamber using an in-line process without the need for long warming periods using offline assemblies, thereby reducing substrate manufacturing throughput.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A vacuum assembly for processing substrates comprising:
    a processing chamber configured to cryogenically process one or more substrates;
    a transfer chamber connected to said processing chamber;
    a substrate handling robot disposed in said transfer chamber, said handling robot configured to displace one or more substrates from said processing chamber to said transfer chamber associated with an in-line processing system; and
    a radiative heater connected to said transfer chamber above said substrate handling robot, said heater projecting energy on at least one of said one or more substrates during an in-line process such that when said substrate handling robot displaces said at least one substrate in said transfer chamber, said heater heats said at least one substrate.

2. The vacuum assembly of claim 1 further comprising a loadlock connected to said transfer chamber, said loadlock having one or more substrate supports for supporting one or more of said substrates.

3. The vacuum assembly of claim 2 wherein said heater is a localized heater such that said heater has a shape corresponding to a shape of said substrate transferred from said process chamber to said transfer chamber.

4. The vacuum assembly of claim 1 wherein said transfer chamber has a first portion above which said heater is disposed, said heater extending across said first portion.

5. The vacuum assembly of claim 1 wherein said transfer chamber is maintained in a vacuum having a first pressure and said process chamber maintained in a vacuum having a second pressure, said substrate transferred from said process chamber to said transfer chamber when said first pressure is substantially equal to said second pressure.

6. The vacuum assembly of claim 1 wherein said heater projects energy on said at least one substrate until a temperature of said at least one substrate is above the dew point of water.

7. The vacuum assembly of claim 2 wherein said substrate handling robot is configured to displace said one or more substrates from said processing chamber to said loadlock.

8. The vacuum assembly of claim 1 wherein said substrate handling robot is a first substrate handling robot, said vacuum assembly further comprising a second substrate handling robot disposed in said transfer chamber, said second handling robot configured to displace one or more substrates from said processing chamber to said transfer chamber.

9. The vacuum assembly of claim 8 wherein said heater is a first heater, said vacuum assembly further comprising a second heater connected to said transfer chamber above said second substrate handling robot such that said second heater projects energy on at least one of said one or more substrates when said second substrate handling robot displaces said at least one substrate in said transfer chamber.

10. The vacuum assembly of claim 1 wherein said heater is an optical heater configured to emit optical energy.

11. The vacuum assembly of claim 1 wherein said heater is configured to emit microwave energy.

12. The vacuum assembly of claim 1 wherein said heater is configured to emit RF energy.

13. A vacuum assembly for processing substrates in an ion implanter comprising:
   a processing chamber configured to cryogenically process one or more substrates;
   a transfer chamber connected to said processing chamber;
   a first substrate handling robot disposed in said transfer chamber, said first handling robot configured to displace one or more substrates from said processing chamber to said transfer chamber;
   a first heater connected to said transfer chamber above said first substrate handling robot such that said first heater projects energy on at least one of said one or more substrates during an in-line process when said substrate handling robot displaces said at least one substrate in said transfer chamber;
   a second substrate handling robot disposed in said transfer chamber, said second handling robot configured to displace one or more substrates from said processing chamber to said transfer chamber; and
   a second heater connected to said transfer chamber above said second substrate handling robot such that said second heater projects energy on at least one of said one or more substrates during the in-line process when said second substrate handling robot displaces said at least one substrate in said transfer chamber.

14. The vacuum assembly of claim 13 wherein said first and second heaters are each configured to emit optical energy.

15. The vacuum assembly of claim 13 wherein said first and second heaters are each configured to emit microwave energy.

16. The vacuum assembly of claim 13 wherein said first and second heaters are each configured to emit RF energy.

17. The vacuum assembly of claim 13 wherein said first heater is a localized heater such that said first heater has a respective shape corresponding to a shape of said one or more substrates transferred from said process chamber to said transfer chamber.

18. The vacuum assembly of claim 13 wherein said second heater is a localized heater such that said second heater has a respective shape corresponding to a shape of said one or more substrates transferred from said process chamber to said transfer chamber.

19. A method of processing substrates comprising:
   providing unprocessed substrates to a loadlock;
   retrieving the unprocessed substrates from the loadlock with a substrate handling robot located within a transfer chamber;
   transferring the unprocessed substrates using the substrate handling robot from the loadlock to a process chamber via the transfer chamber;
   processing the substrate in the process chamber at Cryogenic temperatures;
   transferring the processed wafer from the process chamber to the transfer chamber using the substrate handling robot;
   exposing the processed substrate to optical energy from an optical heater located above the substrate handling robot in the transfer chamber;
   determining if the temperature of the cryogenically processed substrate is above the clew point; and
   transferring the substrate to the loadlock when the temperature of the cryogenically processed substrate is above the dew point.

* * * * *